United States Patent
Chang et al.

(10) Patent No.: US 8,340,940 B2
(45) Date of Patent: Dec. 25, 2012

(54) MULTIPLY APPARATUS FOR SEMICONDUCTOR TEST PATTERN SIGNAL

(75) Inventors: Kyung-hun Chang, Yongin-si (KR); Se-kyung Oh, Seongnam-si (KR)

(73) Assignee: International Trading & Technology Co., Ltd. (KR)

( * ) Notice: Subject to any disclaimer, the term of this patent is extended or adjusted under 35 U.S.C. 154(b) by 306 days.

(21) Appl. No.: 12/739,557

(22) PCT Filed: Oct. 17, 2008

(86) PCT No.: PCT/KR2008/006156
§ 371 (c)(1),
(2), (4) Date: Apr. 23, 2010

(87) PCT Pub. No.: WO2009/054651
PCT Pub. Date: Apr. 30, 2009

(65) Prior Publication Data
US 2010/0262397 A1    Oct. 14, 2010

(30) Foreign Application Priority Data

Oct. 24, 2007  (KR) .................. 10-2007-0107080

(51) Int. Cl.
*G01R 31/26* (2006.01)
*G06F 19/00* (2011.01)
(52) U.S. Cl. ......... 702/120; 702/182; 714/724; 714/738
(58) Field of Classification Search .................. 702/120, 702/125, 182; 257/48; 324/762.01; 369/53.35, 369/59.25; 714/724, 738, 744
See application file for complete search history.

(56) References Cited

U.S. PATENT DOCUMENTS

| 6,092,225 A * | 7/2000 | Gruodis et al. ............... 714/724 |
| 6,119,257 A | 9/2000 | Negishi |
| 2004/0122620 A1 * | 6/2004 | Doi et al. ..................... 702/182 |
| 2006/0163572 A1 | 7/2006 | Jeong et al. |

FOREIGN PATENT DOCUMENTS

| KR | 10-2005-0041560 | 5/2005 |
| KR | 10-2006-0085434 | 7/2006 |

OTHER PUBLICATIONS

International Search Report-PCT/KR2008/006156 dated Jan. 19, 2009.
Written Opinion-PCT/KR2008/006156 dated Jan. 19, 2009.

* cited by examiner

*Primary Examiner* — John H Le
(74) *Attorney, Agent, or Firm* — Cantor Colburn LLP

(57) ABSTRACT

An apparatus for multiplying a semiconductor test pattern signal, which firstly encodes a plurality of pattern signals to have different pattern types, and multiplies the encoded pattern signals according to an exclusive-OR (XOR) scheme in order to generate a single pattern signal, thereby recognizing a relationship between a pattern signal before the multiplication and the other pattern signal after the multiplication. A pattern-signal segmenting/outputting unit segments a semiconductor test pattern signal into a plurality of pattern signals, and simultaneously outputs the segmented pattern signals. A pattern-signal restoring/multiplying unit restores the segmented pattern signals received from the pattern-signal segmenting/outputting unit to the semiconductor test pattern signal, outputs the restored result to a driver which records a test pattern in an objective semiconductor to be tested, and multiplies the signal outputted to the driver by a predetermined frequency band rather than a frequency band of the segmented signals.

3 Claims, 7 Drawing Sheets

FIG. 8

| PG1 | PG2 | D |
|---|---|---|
| ⎍ | ⎍ | L L |
| ⎍ | ⎴ | L H |
| ⎴ | ⎍ | H L |
| ⎴ | ⎴ | H H |

MULTIPLY APPARATUS FOR SEMICONDUCTOR TEST PATTERN SIGNAL

TECHNICAL FIELD

The present invention relates to an apparatus for multiplying a semiconductor test pattern signal, and more particularly to an apparatus for multiplying a semiconductor test pattern signal, which firstly encodes a plurality of pattern signals to have different pattern types, and multiplies the encoded pattern signals according to an exclusive-OR (XOR) scheme in order to generate a single pattern signal, thereby recognizing a relationship between a pattern signal before the multiplication and the other pattern signal after the multiplication.

BACKGROUND ART

As well known in the art, a semiconductor manufactured by a semiconductor manufacturing process generally experiences a test process capable of determining whether or not the semiconductor is correctly operated according to its own characteristics. This test process for the semiconductor has been conducted by a semiconductor test system. A conventional semiconductor test system will hereinafter be described with reference to FIGS. 1 to 5.

FIG. 1 is a perspective view illustrating the conventional semiconductor test system. FIG. 2 is a block diagram illustrating a conventional semiconductor test header apparatus. FIG. 3 is a block diagram illustrating a conventional apparatus for multiplying a semiconductor test pattern signal. FIGS. 4 and 5 exemplarily illustrate signal waveforms of the conventional apparatus for multiplying the semiconductor test pattern signal.

Referring to FIG. 1, the conventional semiconductor test system includes a test head 2, a handler 3, and a HIFIX board 1. The test head 2 tests a semiconductor. The handler 3 carries out a test on a plurality of semiconductors by transferring the plurality of semiconductors, and classifies the semiconductors according to the result of the test executed by the test head 2. The HIFIX board 1 is located between the test head 2 and the handler 3, such that it establishes an electrical connection between the semiconductor and the test head 2. In other words, if the semiconductor seated in an insert on a test tray is brought into contact with the sockets on the HIFIX board 1 on the condition that the HIFIX board 1 having sockets of an (m×n) matrix is matched with a test site of the handler 3, the conventional semiconductor test system can simultaneously test (m×n) semiconductors.

In the meantime, as shown in FIG. 2, the test head 2 includes a single test head substrate and a variety of circuit elements mounted on one or both sides of the test head substrate. This test head substrate includes a Pattern Generator (PG) 10, a Pin Electronic (PE) unit 30, a control computer 5, and an interface (I/F) unit 70. The pattern generator (PG) 10 generates a predetermined test pattern signal for testing the semiconductor. The pin electronic (PE) unit 30 includes: a driver 31 for recording the test pattern signal generated from the pattern generator (PG) 10 in a Device Under Test (DUT) 50; and a comparator 33 for comparing a read signal of the test pattern read by the DUT 50 with a reference signal corresponding to characteristics of the corresponding semiconductor and outputting the result of the comparison. The control computer 5 controls the semiconductor test system. The interface (I/F) unit 70 allows the control computer 5 for controlling the semiconductor test system to interface with the test head 2.

In this case, the PE unit 30 is a circuit for directly applying current and voltage signals based on test patterns to the semiconductor contained in the DUT 50. If the test pattern generator of the PG 10 generates the test pattern signal, the driver 31 contained in the PE unit 30 records a corresponding test pattern signal in a test-objective semiconductor contained in the Ball Grid Array (BGA) type DUT 50. The recorded pattern signal is read by the DUT 50, such that the read pattern signal is outputted to the comparator 33. The comparator 33 transmits a comparison resultant signal indicating the comparison result between the read signal of the test pattern and the reference signal to the control computer 5 via the interface (I/F) unit 70. The control computer 5 analyzes a corresponding comparison signal, such that it can test whether or not the corresponding semiconductor is correctly operated according to its own characteristics.

In the meantime, the semiconductor test system may be manufactured by different manufacturing companies, such that it may be driven by a signal which may have different frequency bands according to the individual manufacturing companies. For example, if the semiconductor test system is operated by a frequency signal of 1 GHz, the test pattern signal generated from the pattern generator (PG) 10 must have the frequency of 1 GHz, and the test pattern signal of 1 GHz indicating a digital signal generated from the pattern generator (PG) 10 is converted into an analog signal of 1 GHz via the PE unit 30, such that the analog signal of 1 GHz is recorded in the DUT 50.

However, a circuit design technology for processing a high frequency signal such as the 1 GHz signal requires a high-level technology, and must consume high costs of manufacturing the circuit, resulting in the increased production costs of the semiconductor test system.

In order to solve the above-mentioned problems, the conventional semiconductor test system manufacturing companies have developed an improved apparatus for multiplying the semiconductor test pattern signal. In this improved apparatus, the PG 10 may be implemented with an Application Specific Integrated Circuit (ASIC) or a Field Programmable Gate Array (FPGA) so as to output a low-frequency test pattern signal, and the low-frequency test pattern signal is multiplied by the ASIC or FPGA end, such that the semiconductor test system can output a signal having a desired frequency band.

That is, as shown in FIG. 3, a conventional apparatus 60 for multiplying the semiconductor test pattern signal includes a first pattern generator (Pattern Generator 1: PG1) 61, a second pattern generator (Pattern Generator 2: PG2) 62, a first formatter (Formatter 1: F1) 63, a second formatter (Formatter 2: F2) 64, and an XOR logic circuit 67. The first formatter (F1) 63 combines a pattern signal received from the first pattern generator (PG1) 61 with a timing signal, and outputs the combined resultant signal. The second formatter (F2) 64 combines a pattern signal received from the second pattern generator (PG2) 62 with the other timing signal different from the above timing signal generated by the first formatter (F1) 63, and outputs the combined resultant signal. The XOR logic unit 67 performs an XOR operation on the signals received from the first and second formatters (F1 and F2) 63 and 64, and outputs the XOR-operation result to the driver 31. In this case, the timing signals generated by the first and second formatters (F1 and F2) 63 and 64 have a phase difference of 180°.

Referring to the signal waveforms of the above-mentioned multiplying apparatus 60 as shown in FIG. 4, if the first pattern generator (PG1) 61 and the second pattern generator (PG2) 62 generate the same pattern signal, the relationship between the pattern signal before the multiplication and the other pattern signal after the multiplication can be readily recognized. That is, the pattern signal D multiplied by the XOR logic circuit 67 may have an amplified frequency band, and its waveform format may be equal to those of the pattern signals generated from the first and second pattern generators (PG1 and PG2) 61 and 62. In more detail, provided that the output signals of the first and second formatter (F1 and F2) 63 and 64 have the same format and a phase difference of 180 therebetween, the XOR logic circuit 67 generates a doubled-frequency waveform having a duty ratio of 50%.

On the other hand, according to the conventional apparatus for multiplying the semiconductor test pattern signal as shown in FIG. 5, if the first pattern generator (PG1) 61 and the second pattern generator (PG2) 62 generate different pattern signals, the conventional apparatus has difficulty in estimating a shape of the pattern signal before the multiplication on the basis of the multiplied pattern signal D. In other words, if the conventional apparatus desires to alternately output a user-desired pattern signal via the first and second pattern generators (PG1 and PG2) 61 and 62, it has a disadvantage in that the first and second pattern generators (PG1 and PG2) 61 and 62 unavoidably output the same signal. If the conventional apparatus desires to output irregular signals different from each other, it must compose an arbitrary pattern program by which different pattern generators (i.e., first and second pattern generators) estimate their output values in different ways. However, if the conventional apparatus is unable to perfectly estimate the output values of the first and second pattern generators (PG1 and PG2) although the above pattern program is used, it is unable to generate the pattern of irregular signals.

DISCLOSURE

Technical Problem

Accordingly, the present invention is directed to an apparatus for multiplying a semiconductor test pattern signal that substantially obviates one or more problems due to limitations and disadvantages of the related art.

Technical Solution

It is an object of the present invention to provide an apparatus for multiplying a semiconductor test pattern signal, which can segment a semiconductor test pattern signal requested by a semiconductor test system into a plurality of pattern signals, can allow a plurality of pattern generators to alternately output the segmented pattern signals by turns, and can multiply the resultant pattern signal by an original pattern signal, such that it outputs the multiplied result.

In accordance with one aspect of the present invention, the above and other objects can be accomplished by the provision of an apparatus for multiplying a semiconductor test pattern signal comprising: a pattern-signal segmenting/outputting unit for segmenting a semiconductor test pattern signal into a plurality of pattern signals, and simultaneously outputting the segmented pattern signals; and a pattern-signal restoring/multiplying unit for restoring the segmented pattern signals received from the pattern-signal segmenting/outputting unit to the semiconductor test pattern signal, outputting the restored result to a driver which records a test pattern in an objective semiconductor to be tested, and multiplying a signal outputted to the driver by a predetermined frequency band rather than a frequency band of the segmented signals.

The pattern-signal segmenting/outputting unit may include: a first pattern generator for generating a predetermined part of the semiconductor test pattern signal, and outputting the predetermined part; and a second pattern generator for generating another part different from the predetermined part generated from the first pattern generator, and outputting the another part. The pattern-signal restoring/multiplying unit may include: an encoder for converting the signals received from the first and second pattern generators into different types of patterns; a first formatter for combining the signal received from the encoder with a timing value, and outputting the combined result; a second formatter for combining the signal received from the encoder with another timing value different from the timing value generated from the first formatter, and outputting the combined result; and a frequency multiplication unit for performing multiplication of the signals received from the first and second formatters, and outputting one signal indicating the multiplied result.

The timing values generated from the first and second formatters may have a phase difference of 180°.

The encoder may include: a first encoder for performing a logic operation between the signal received from the first pattern generator and a signal received from a buffer, and outputting the logic operation result; a second encoder for performing a logic operation between the signal received from the first encoder and the other signal received from the second pattern generator, and outputting the logic operation result; and the buffer for transmitting the signal received from the second encoder to the first encoder according to a periodic clock signal.

The first encoder or the second encoder may be implemented with an XOR logic circuit, and the buffer may be implemented with a D-flip-flop.

It is to be understood that both the foregoing general description and the following detailed description of the present invention are exemplary and explanatory and are intended to provide further explanation of the invention as claimed.

Advantageous Effects

As apparent from the above description, the apparatus for multiplying the semiconductor test pattern signal according to the present invention can segment a semiconductor test pattern signal requested by a semiconductor test system into a plurality of pattern signals, can allow a plurality of pattern generators to alternately output the segmented pattern signals by turns, and can multiply the resultant pattern signal by an original pattern signal, such that it outputs the multiplied result.

DESCRIPTION OF DRAWINGS

The above and other objects, features and other advantages of the present invention will be more clearly understood from the following detailed description taken in conjunction with the accompanying drawings, in which:

FIG. 8 is a truth table illustrating a relationship between a pattern signal before the multiplication performed by the multiplying apparatus and the other pattern signal after the multiplication.

MODE FOR INVENTION

An apparatus for multiplying a semiconductor test pattern signal according to the present invention will hereinafter be described with reference to the annexed drawings.

Figure 1:
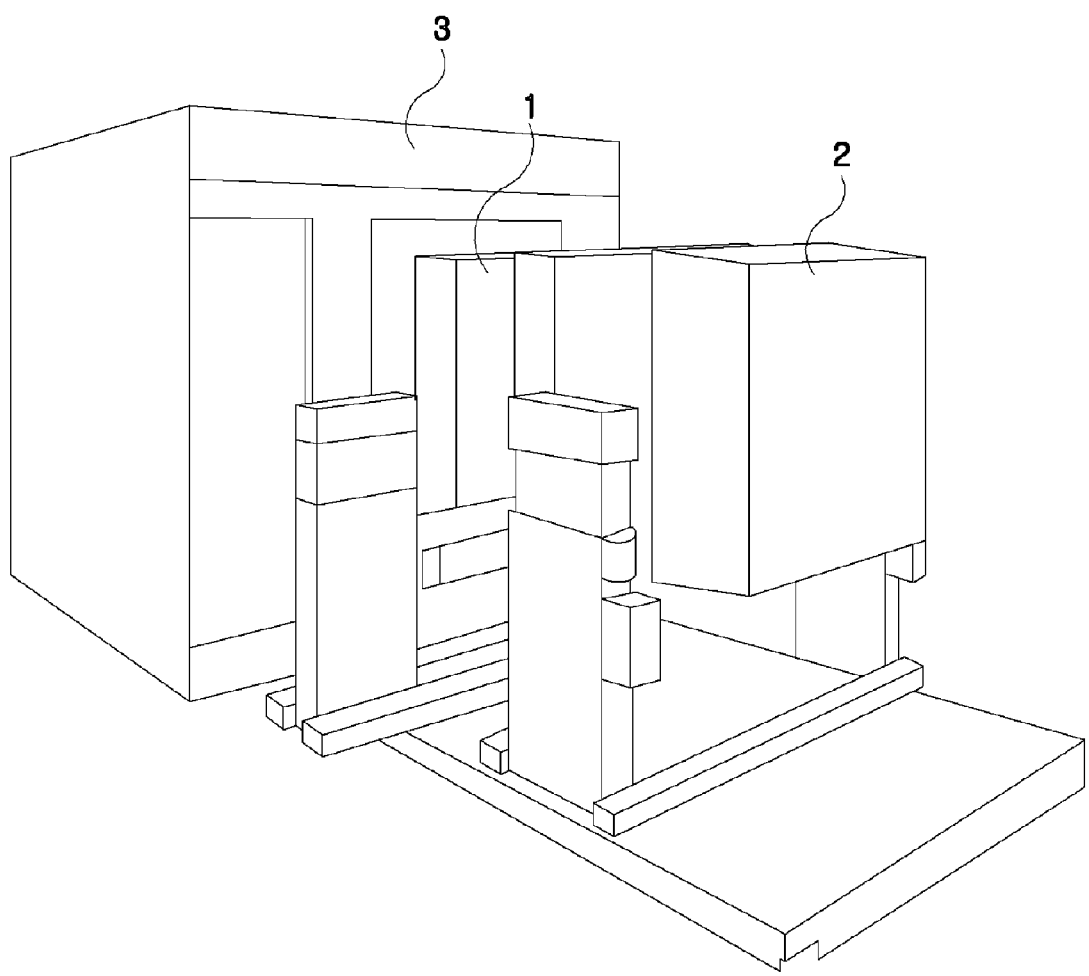
FIG. 1 is a perspective view illustrating a conventional semiconductor test system.
Figure 2:
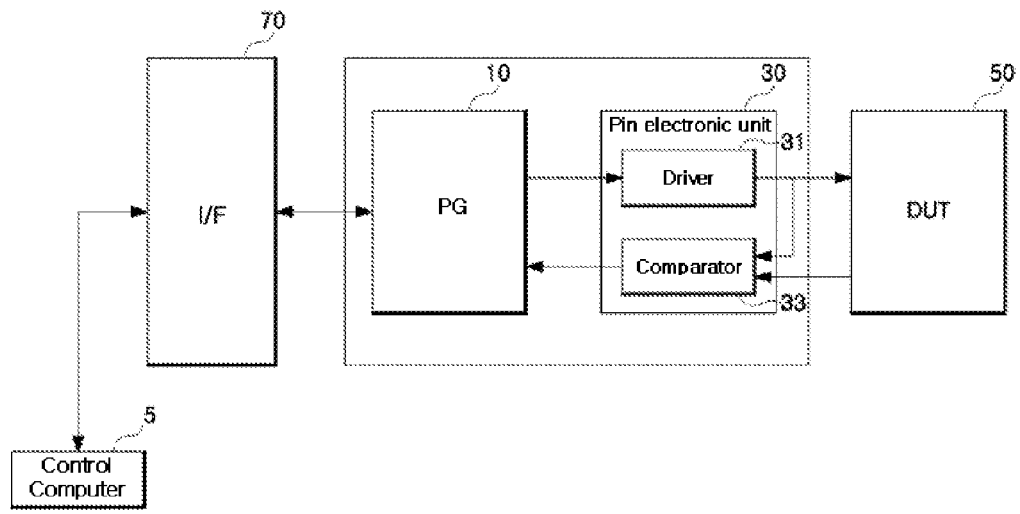
FIG. 2 is a block diagram illustrating a conventional semiconductor test header apparatus.
Figure 3:
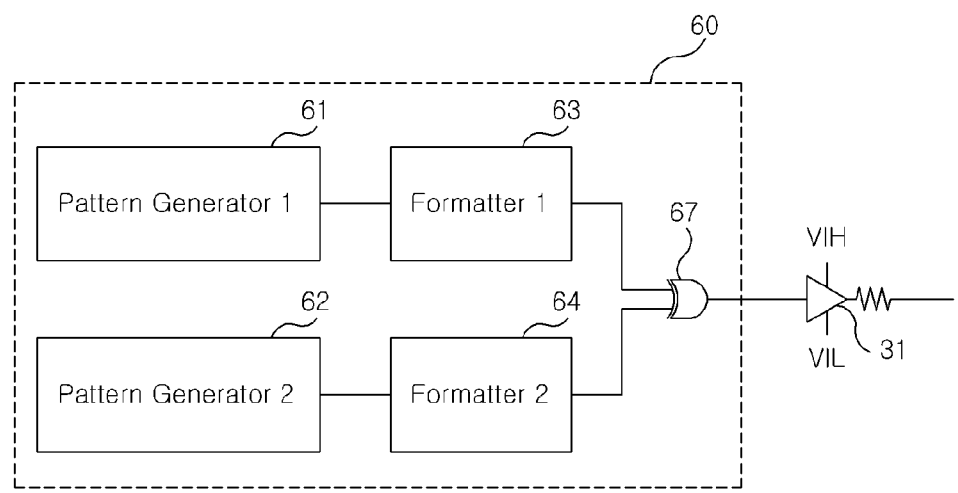
FIG. 3 is a block diagram illustrating a conventional apparatus for multiplying a semiconductor test pattern signal.
Figure 4:
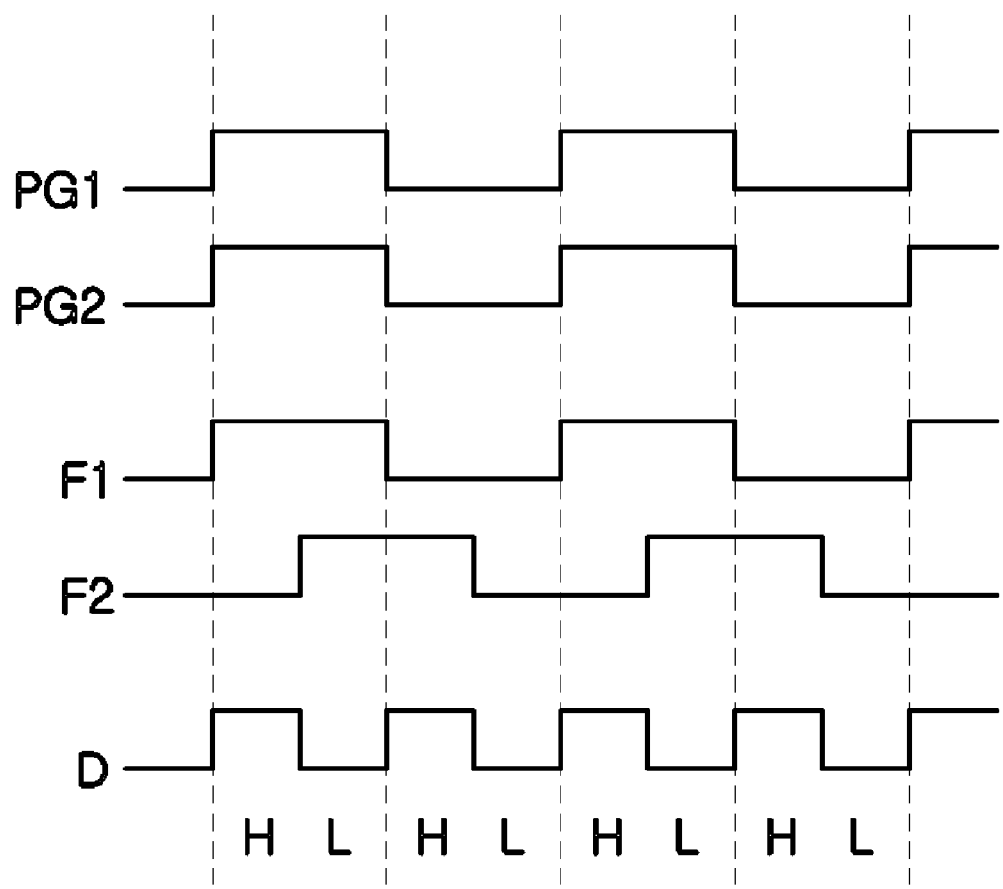
FIGS. 4 and 5 exemplarily illustrate signal waveforms of the conventional apparatus for multiplying the semiconductor test pattern signal.
Figure 5:
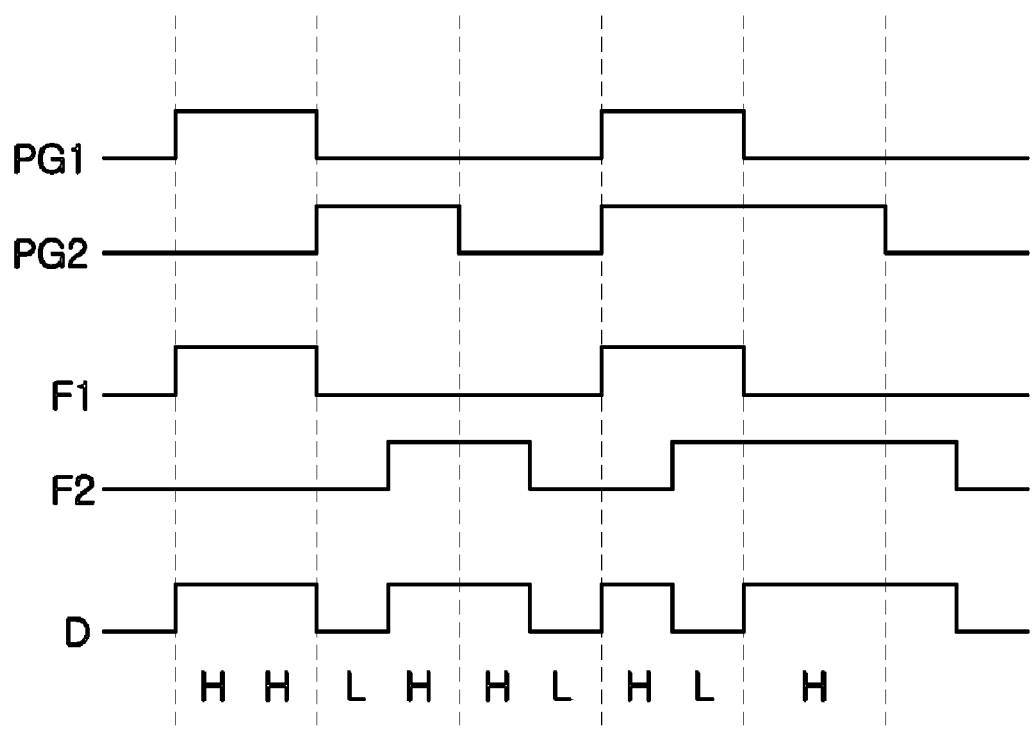
Figure 6:
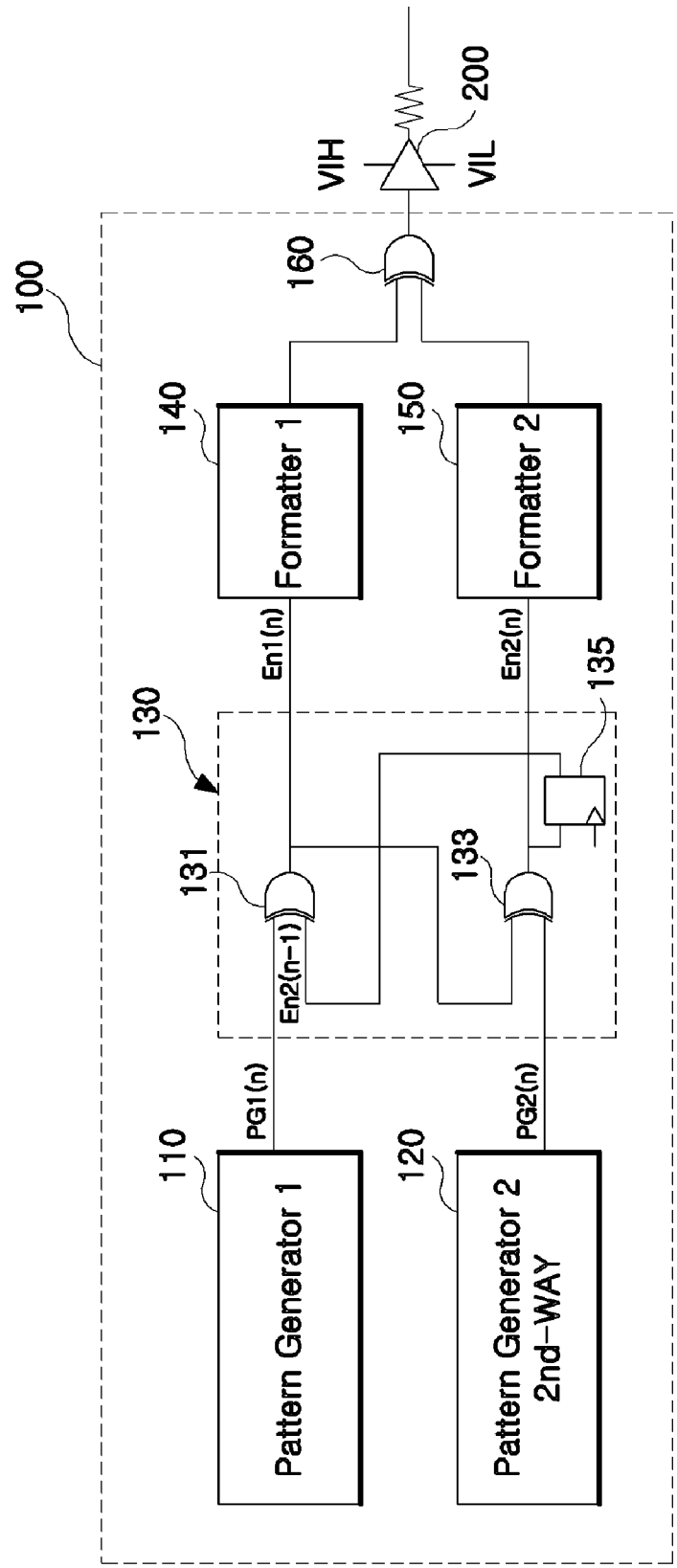
FIG. 6 is an electrical block diagram illustrating an apparatus for multiplying a semiconductor test pattern signal according to the present invention.
Figure 7:
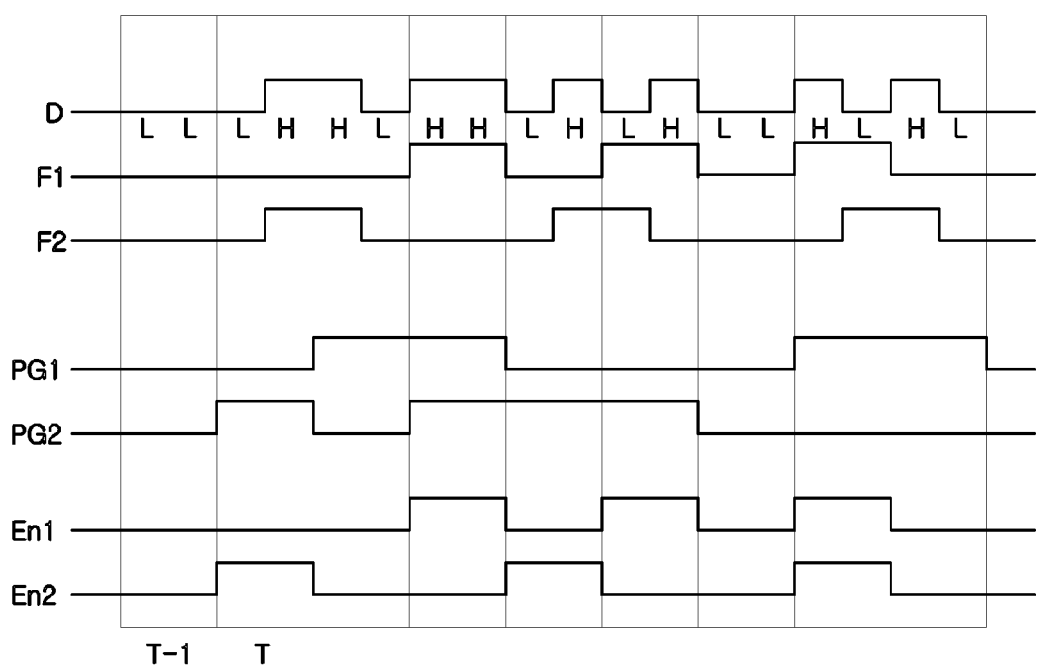
FIG. 7 exemplarily illustrates a signal waveform for use in the apparatus for multiplying the semiconductor test pattern signal of FIG. 6 according to the present invention.
Figure 8:
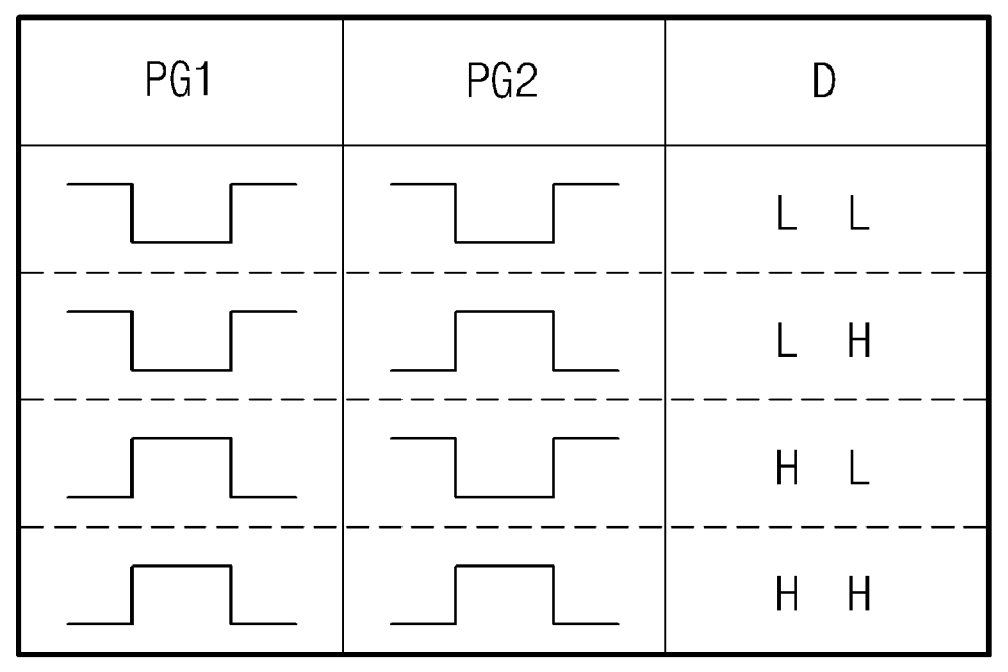

FIG. 6 is an electrical block diagram illustrating an apparatus for multiplying a semiconductor test pattern signal according to the present invention. FIG. 7 exemplarily illustrates a signal waveform for use in the apparatus for multiplying the semiconductor test pattern signal of FIG. 6 according to the present invention. FIG. 8 is a truth table illustrating a relationship between a pattern signal before the multiplication performed by the multiplying apparatus and the other pattern signal after the multiplication.

Referring to FIG. 6, the apparatus 100 for multiplying the semiconductor test pattern signal (hereinafter referred to as the multiplying apparatus 100) according to the present invention may generally include a pattern-signal segmenting/outputting unit and a pattern-signal restoring/multiplying unit. In more detail, the pattern-signal segmenting/outputting unit may segment the semiconductor test pattern signal into a plurality of pattern signals, and may simultaneously output the segmented pattern signals. The pattern-signal restoring/multiplying unit may restore the segmented pattern signals received from the pattern-signal segmenting/outputting unit to an original semiconductor test pattern signal, may output the restored result to a driver which records a test pattern in an objective semiconductor to be tested, and may multiply the signal outputted to the driver by a predetermined frequency band rather than a frequency band of the segmented signals.

In the above-mentioned configuration, the pattern-signal segmenting/outputting unit may include a first pattern generator (Pattern Generator 1: PG1) 110 and a second pattern generator (Pattern Generator 2: PG2) 120. The pattern-signal restoring/multiplying unit may further include an encoder 130, a first formatter (Formatter 1: F1) 140, a second formatter (Formatter 2: F2) 150, and a frequency multiplication unit 160.

In this case, the first pattern generator 110 may output a predetermined part of the semiconductor test pattern signal, and the second pattern generator 120 may output another part different from the predetermined part outputted from the first pattern generator 110. For example, the first pattern signal for an initial period (i.e., a first period) is generated from the first pattern generator (PG1) 110, and the second pattern signal for the next period is generated from the second pattern generator (PG2) 120 in such a way that the first pattern generator (PG1) 110 and the second pattern generator (PG2) 120 alternately output the first and second pattern signals.

The encoder 130 converts the first and second pattern signals generated from the first and second pattern generators 110 and 120 into different types of patterns, and outputs the different types of patterns in such a way that it performs an encoding function. In more detail, the encoder 130 includes a first encoder (En1) 131, a second encoder (En2) 133, and a buffer 135. The first encoder (En1) 131 receives one signal PG1($n$) from the first pattern generator (PG1) 110, receives the other signal En2($n-1$) from the buffer 135, and performs an XOR operation between the received signals PG1($n$) and En2($n-1$). The second encoder (En2) 133 receives one signal En1($n$) from the first encoder (En1) 131, receives the other signal PG2($n$) from the second pattern generator (PG2) 120, and performs the XOR operation between the received signals En1($n$) and PG2($n$). The buffer 135 transmits the signal received from the second encoder (En2) 133 to the first encoder (En1) 131 according to a periodic clock signal. In this case, it is more preferable that each of the first and second encoders 131 and 133 may be implemented with an XOR logic circuit and the buffer 135 may be implemented with a D-flipflop (also called a Data-F/F).

The first formatter (F1) 140 combines the pattern signal received from the first encoder (En1) 131 with the timing signal. The second formatter (F2) 150 combines the pattern signal received from the second encoder (En2) 133 with the other timing signal different from that of the first formatter (F1) 140. In this case, the timing signals generated from the first and second formatters (F1 and F2) 140 and 150 may have a phase difference of 180°.

The frequency multiplication unit 160 performs multiplication of the pattern signals received from the first and second formatters (F1 and F2) 140 and 150, and outputs a single pattern signal indicating the multiplied result. It is preferable that the frequency multiplication unit 160 may be implemented with an XOR logic circuit.

The signal waveform of the multiplying apparatus 100 will hereinafter be described with reference to FIG. 7. Although the first pattern generator (PG1) 110 and the second pattern generator (PG2) 120 generate different formats of pattern signals, the pattern signal D multiplied by the frequency multiplication unit 160 is amplified twice and is equal to the pattern signal generated from the first or second pattern generator 110 or 120. For example, provided that the first pattern generator (PG1) 110 outputs the value of '0' at a specific time T, the second pattern generator (PG2) 120 outputs the other value of '1' at the time T, and the second encoder (En2) 133 outputs the value of '0' at a time T−1, the first encoder (En1) 131 performs the XOR operation between the two values '0' such that it output the resultant value of '0', and the second encoder (En2) 133 performs the XOR operation between the two values '0' and '1' such that it outputs the resultant value of '1'. The first formatter (F1) 140 combines the signal received from the first encoder (En1) 131 with a predetermined timing value, and outputs the combined result. The second formatter (F2) 150 combines the signal received from the second encoder (En2) 133 with a timing value which has a phase difference of 180° with the other timing value generated from the first formatter (F1) 140, and outputs the combined result. In other words, if the timing value generated from the first formatter 140 is '0', the first formatter (F1) 140 transmits the input signal received from the first encoder (En1) 131 to the frequency multiplication unit 160 without any change, and the second formatter (F2) 150 shifts the input signal received from the second encoder (En2) 133 by a half period and outputs the shifted result to the frequency multiplication unit 160. Therefore, the frequency multiplication unit 160 outputs a pattern signal D corresponding to the value of '01(LH)' during a single period, and its associated description is shown in FIG. 8.

The apparatus for multiplying a semiconductor test pattern signal is not limited to only the above-mentioned embodiment, and can also be modified in various ways within the scope or spirit of the present invention. For example, although the above-mentioned description has exemplarily disclosed the above-mentioned frequency multiplying apparatus including two pattern generators, three or more pattern generators may be contained in the above-mentioned frequency multiplying apparatus as necessary. Unless the three or more pattern generators are contained in the above-mentioned frequency multiplying apparatus, the design of the encoder denoted by the reference number 130 must be modified according to the number of necessary pattern generators.

The invention claimed is:

1. An apparatus for multiplying a semiconductor test pattern signal comprising:
   a pattern-signal segmenting/outputting unit for segmenting a semiconductor test pattern signal into a plurality of pattern signals, and simultaneously outputting the segmented pattern signals; and
   a pattern-signal restoring/multiplying unit for restoring the segmented pattern signals received from the pattern-signal segmenting/outputting unit to the semiconductor test pattern signal, outputting the restored result to a driver which records a test pattern in an objective semiconductor to be tested, and multiplying the signal outputted to the driver by a predetermined frequency band rather than a frequency band of the segmented signals,
   wherein the pattern-signal segmenting/outputting unit includes:
      a first pattern generator for generating a predetermined part of the semiconductor test pattern signal, and outputting the predetermined part; and
      a second pattern generator for generating another part different from the predetermined part generated from the first pattern generator, and outputting the another part, and
   the pattern-signal restoring/multiplying unit includes:
      an encoder for converting the signals received from the first and second pattern generators into different types of patterns;
      a first formatter for combining the signal received from the encoder with a timing value, and outputting the combined result;
      a second formatter for combining the signal received from the encoder with another timing value different from the timing value generated from the first formatter, and outputting the combined result; and
      a frequency multiplication unit for performing multiplication of the signals received from the first and second formatters, and outputting one signal indicating the multiplied result
   wherein the encoder includes:
      a first encoder for performing a logic operation between the signal received from the first pattern generator and a signal received from a buffer, and outputting the logic operation result;
      a second encoder for performing a logic operation between the signal received from the first encoder and the other signal received from the second pattern generator, and outputting the logic operation result; and
      the buffer for transmitting the signal received from the second encoder to the first encoder according to a periodic clock signal.

2. The apparatus according to claim 1, wherein the timing values generated from the first and second formatters have a phase difference of 180°.

3. The apparatus according to claim 1, wherein the first encoder or the second encoder is implemented with an XOR logic circuit, and the buffer is implemented with a D-flip-flop.

* * * * *